United States Patent
Kocon et al.

(10) Patent No.: US 8,294,210 B2
(45) Date of Patent: Oct. 23, 2012

(54) HIGH VOLTAGE CHANNEL DIODE

(75) Inventors: Christopher Boguslaw Kocon, Mountain Top, PA (US); John Manning Savidge Neilson, Norristown, PA (US); Simon John Molloy, Allentown, PA (US); Haian Lin, Bethlehem, PA (US); Charles Walter Pearce, Emmaus, PA (US); Gary Eugene Daum, Orwigsburg, PA (US)

(73) Assignee: Texas Instruments Incorporated, Dallas, TX (US)

( * ) Notice: Subject to any disclaimer, the term of this patent is extended or adjusted under 35 U.S.C. 154(b) by 24 days.

(21) Appl. No.: 12/815,877

(22) Filed: Jun. 15, 2010

(65) Prior Publication Data

US 2011/0303976 A1    Dec. 15, 2011

(51) Int. Cl.
*H01L 29/66* (2006.01)
*H01L 21/336* (2006.01)

(52) U.S. Cl. ......... 257/337; 257/E29.255; 257/E29.327; 257/E21.352; 257/E21.409; 438/268

(58) Field of Classification Search ............... 257/337, 257/268, 270, E29.255, E29.327, E21.352, 257/E21.409; 438/268, 286, 270
See application file for complete search history.

(56) References Cited

U.S. PATENT DOCUMENTS

| | | | |
|---|---|---|---|
| 5,587,329 A * | 12/1996 | Hseuh et al. | ........... 438/30 |
| 6,476,442 B1 | 11/2002 | Williams et al. | |
| 7,235,845 B2 | 6/2007 | Xu et al. | |
| 7,282,765 B2 | 10/2007 | Xu et al. | |

* cited by examiner

*Primary Examiner* — A. Sefer
*Assistant Examiner* — Nikolay Yushin
(74) *Attorney, Agent, or Firm* — Jacqueline J. Garner; Wade J. Brady, III; Frederick J. Telecky, Jr.

(57) ABSTRACT

A channel diode structure having a drift region and method of forming. A charge balanced channel diode structure having an electrode shield and method of forming.

10 Claims, 9 Drawing Sheets

HIGH VOLTAGE CHANNEL DIODE

CROSS-REFERENCE TO RELATED APPLICATIONS

The following co-pending patent applications are related and hereby incorporated by reference: U.S. patent application Ser. No. 12/815,766 (Texas Instruments docket number TI-67812, filed simultaneously with this application), and U.S. patent application Ser. No. 12/139,984 filed Jun. 16, 2008 Publication No. 20080246086. With its mention in this section, this patent application is not admitted to be prior art with respect to the present invention.

FIELD OF THE INVENTION

This invention relates to the field of integrated circuits. More particularly, this invention relates to improved channel diode structures and methods of making the same.

BACKGROUND OF THE INVENTION

Figure 1:
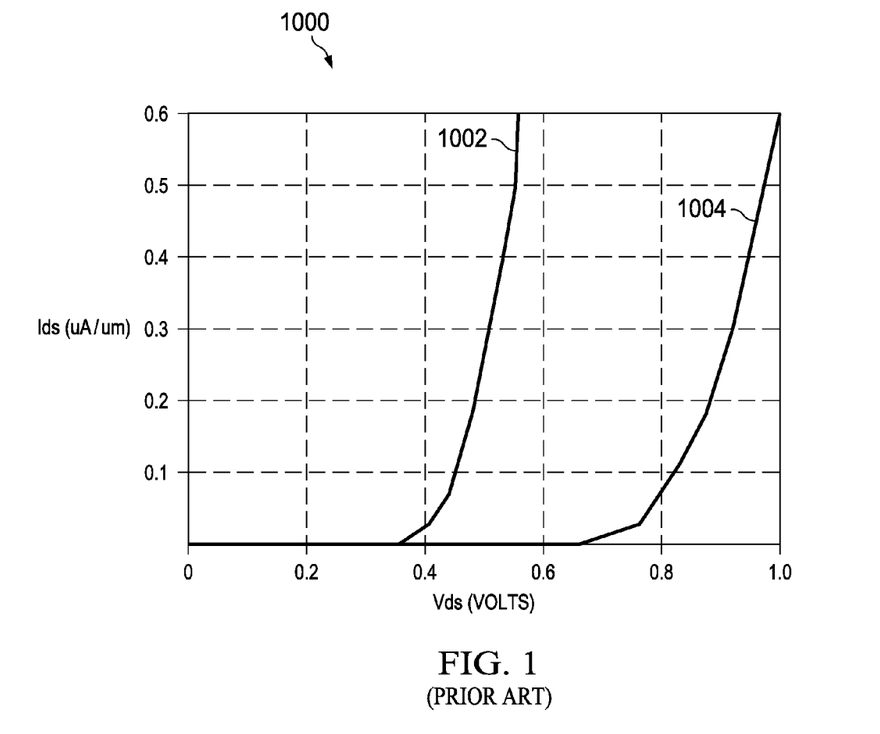
FIG. 1 is a graph of current versus voltage curves for a conventional diode and a channel diode.
Figure 2:
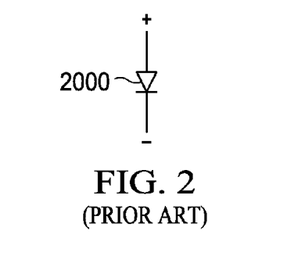
FIG. 2 (Prior art) is a schematic diagram of a conventional diode

The function of a channel diode also called a pseudo-Schottky diode (reference U.S. Pat. No. 6,476,442) is described in FIG. 1. The forward biased current versus voltage curve of a conventional PN diode such as show in FIG. 2 is given by curve 1004 in FIG. 1. A diode offset voltage of about 0.7 volts must be overcome before current begins to flow in the forward biased direction. The current in a PN diode consists of both majority and minority carriers. After the PN diode has carried a forward current, the voltage supporting region contains a mixture of minority and majority carriers and cannot support a reverse voltage until sufficient time has passed for the excess minority carriers to recombine so that a depletion region may reform. This results in the PN junction having a long recovery time when compared to a majority carrier only device.

Figure 3:
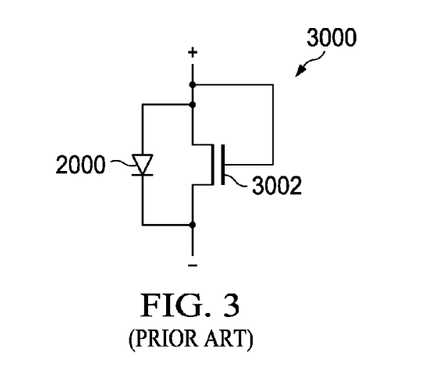
FIG. 3 (Prior art) is a schematic diagram of a channel diode.

Current versus voltage curve, 1002, is of a channel diode such as is illustrated in FIG. 3. The channel diode 3000 consists of an NMOS transistor, 3000, with gate shorted to source and body in parallel with source to body PN diode 2000. When the body potential of transistor 3000 begins to rise the source to body offset voltage is reduced and the turn on voltage of transistor 3000 is lowered due to the body effect. The rising source voltage also raises the voltage of the gate causing transistor 3000 to turn on at about 0.4 volts as shown by curve, 1002, in FIG. 1. The lower turn on voltage of the channel diode results in less power loss than the conventional PN diode. In addition, since conduction through the channel of transistor, 3002, in channel diode, 3000, is majority carrier only, recovery time to begin supporting reverse voltages is virtually instantaneous and significantly faster than a PN diode.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

The invention is a channel diode structure and method of forming the same. The channel diode structure has a drift region that enables high voltage applications. In one embodiment the channel diode structure is a charge balanced channel diode structure.

DESCRIPTION OF THE VIEWS OF THE DRAWING

FIG. 9A through 9J are illustrations of steps in the fabrication of integrated circuits formed according to embodiments.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 4:
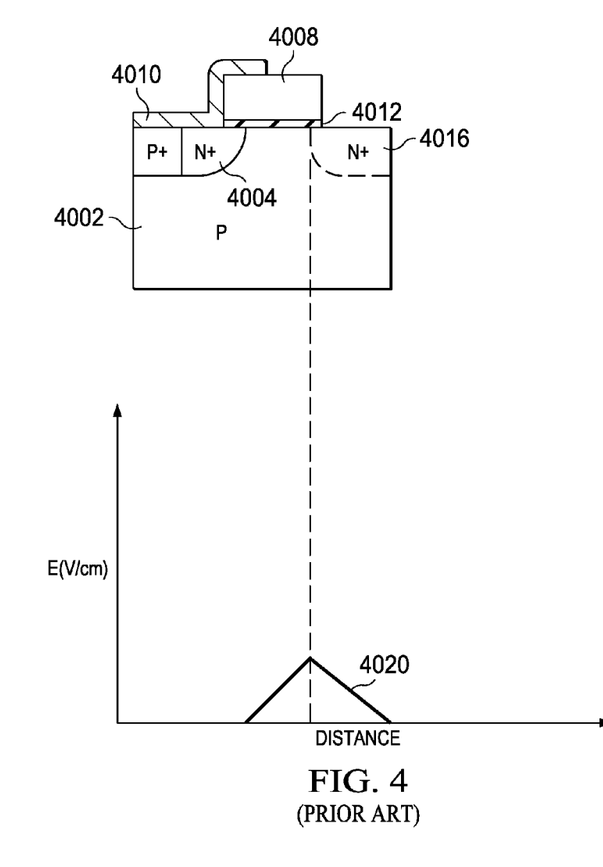
FIG. 4 (Prior art) is a graph of the electric field profile and a cross-sectional diagram of a conventional channel diode.

A cross-sectional view of an NMOS channel diode is shown in FIG. 4. The conventional channel diode may be formed by shorting the gate 4008 to the source 4004 and the body 4002 using a shorting strap, 4010.

The graph below the cross-sectional view in FIG. 4 shows the electric field distribution across the drain 4016, transistor body 4002 diode junction 4012. The vertical dashed line indicates the location of the PN junction. The area under the electric field curve 4020 is the maximum voltage that this junction can support (ie. the breakdown voltage.)

Figure 5:
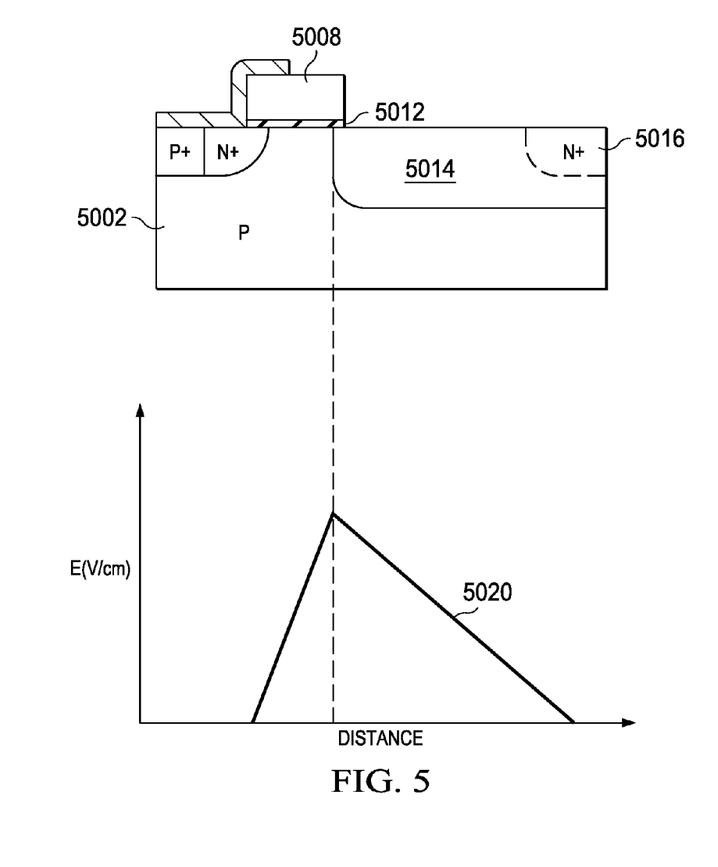
FIG. 5 is a graph of the electric field profile and a cross-sectional diagram of a channel diode with a drift region formed according to principles of the invention.

An embodiment high voltage channel diode (HVCD) which may support a higher voltage is shown in FIG. 5. A lightly doped drift region 5014 has been formed between the gate 5008 and the heavily doped drain region 5016. When a high voltage is applied to the drain 5016, the drift region 5014 fully depletes. The drift region may be designed to drop sufficient voltage across the depleted drift region, 5014 to prevent damage to a low voltage gate oxide under the gate 5008. The electric field distribution across the HVCD is shown in the graph below the cross-sectional view. The area under the electric field curve 5020 is the maximum voltage that this diode can support. It is evident that the area under the electric field curve, 5020 is significantly greater than the area under the electric field curve, 4020, showing that the embodiment HVCD may support a significantly higher voltage than the conventional channel diode.

Figure 6:
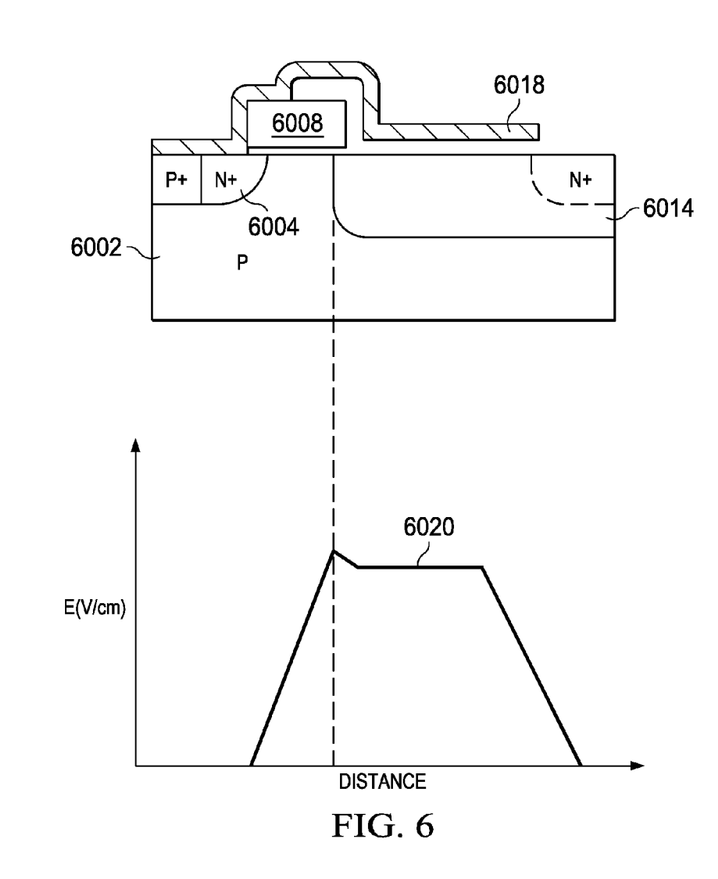
FIG. 6 is a cross-sectional diagram of a channel diode with a drift region and an electrode shield formed according to principles of the invention.

A second embodiment channel diode which may support a higher voltage is shown in FIG. 6. The strap that shorts the gate 6008 to the source 6004 and body 6002 is extended to form an electrode shield 6018 over a portion of the drift region 6014 forming a charge balanced channel diode (CBCD). The electric field distribution across CBCD is shown in the graph below the cross-sectional view of the embodiment CBCD. The electrode shield 6018 balances the charge in the drift region 6014 causing the electric field to remain approximately constant across the drift region 6014 underlying the electrode shield 6018. This increases the area under the electric field curve 6020. Since the area under the electric field curve 6020 is the maximum voltage that this region can support this increased area allows the charge balanced channel diode to support a higher voltage that the HVCD in FIG. 5. Alternatively a CBCD that supports a high voltage equivalent to the channel diode in FIG. 5 may be built in a smaller area reducing cost.

Figure 7:
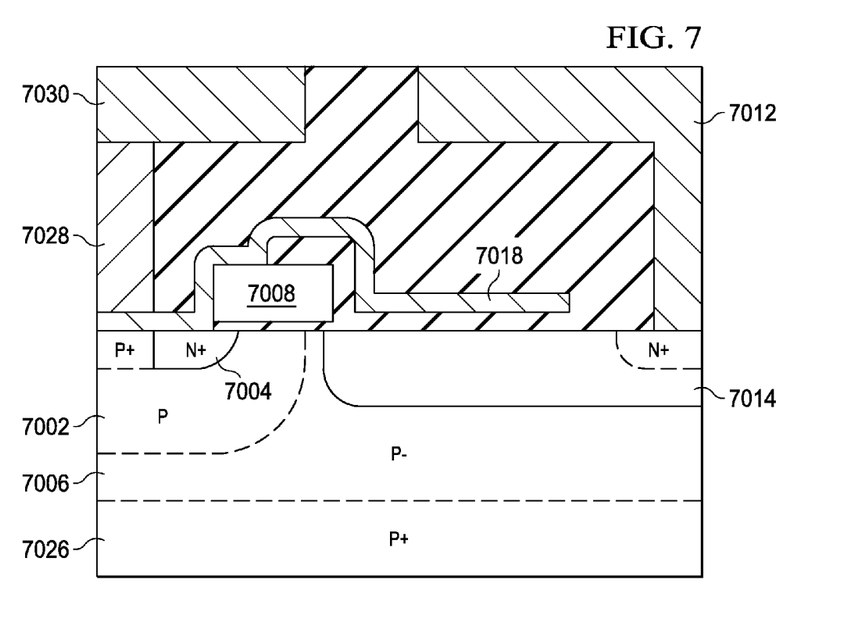
FIG. 7 is a cross-sectional diagram of a channel diode with a drift region, an electrode shield, and a topside anode formed according to principles of the invention.

A channel diode similar to the CBCD in FIG. 6 but including topside terminals is shown in FIG. 7. The CBCD is constructed in a p-epi layer 7006 which is grown on a p-substrate 7026. The source 7004 and drift region 7014 are self aligned to the gate 7008. The electrode shield 7018 shorts the gate 7008, source 7004 and body 7002 together and overlies a portion of the drift region 7014. When a high voltage is applied to the cathode terminal 7012 the lightly doped drift region 7014 fully depletes dropping sufficient voltage to protect the dielectric under the gate 7008. When the voltage on the anode terminal 7030 starts to rise causing the source 7004/body 7002 junction to start to forward bias, the body 7002 potential also starts to rise since it is shorted to the anode 7030. This rise in body potential lowers the turn on voltage of the channel under the gate 7008. In addition, since the gate 7008 is shorted to the anode, 7030, the gate potential also starts to rise. The rise in gate 7008 voltage plus the lowering of the channel turn on voltage results in formation of a channel under the gate 9008 which begins to conduct before the source 7004/body 7002 junction becomes forward biased. The conduction of the channel diode occurs at a lower voltage than the forward biased PN junction resulting in reduced operating power. In addition, since conduction through the CBCD is majority carrier only, recovery time to begin supporting reverse voltages is virtually instantaneous and significantly faster than a PN diode. This is especially advantageous for high frequency, high voltage power circuits.

Figure 8:
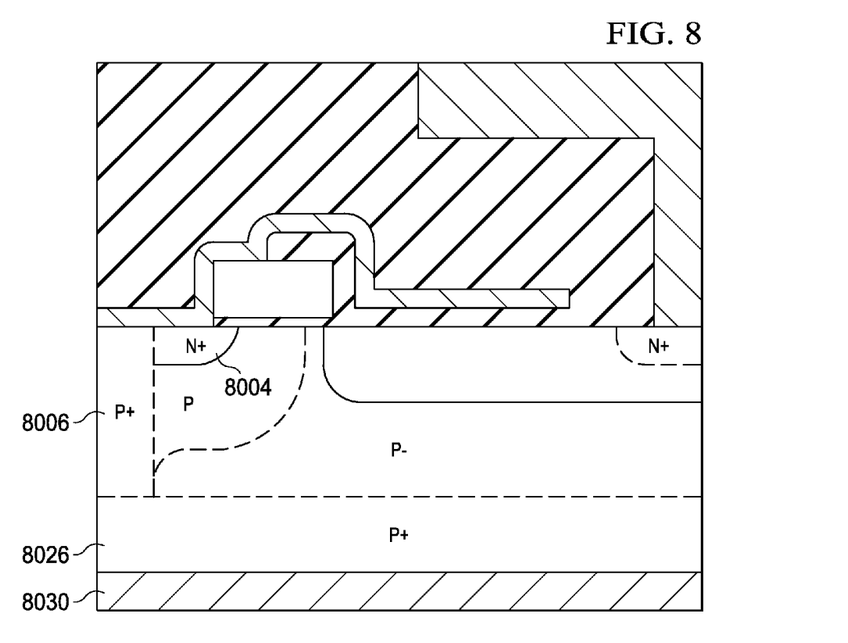
FIG. 8 is a cross-sectional diagram of a channel diode with a drift region, an electrode shield, and a bottom side anode formed according to principles of the invention.

The series resistance of the interface between the topside anode contact 7028 and the transistor source 7004 may limit channel diode performance especially at high frequency and may also consume power. An embodiment channel diode with lower source series resistance is shown in FIG. 8. In this embodiment a low resistance p-sinker 8006 forms a low resistance path from the source 8004 to the substrate 8026. The series resistance of this CBCD with a backside anode terminal 8030 may be significantly lower than the source resistance of the CBCD shown in FIG. 7. The performance of a CBCD with a backside anode, 8030, may be significantly improved over the performance of a CBCD with a topside anode, 7030, especially at high frequencies. In addition, the power consumed by a CBCD with a low resistance backside anode 8030 may be significantly less than the power consumed by a CBCD with a higher resistance topside anode, 7030.

The major steps in a process flow that may be used to form the CBCD in FIG. 8 are illustrated in the cross sections in FIGS. 9A through 9J.

Figure 9A:
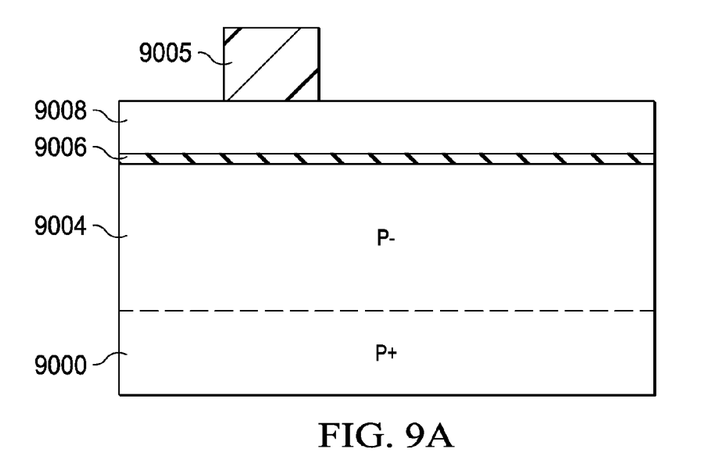

A cross section of a partially processed integrated circuit is shown in FIG. 9A. A p-type layer, 9004 may be epitaxially grown on an p-type substrate 9000 that has been processed through shallow trench isolation (STI), and transistor turn on voltage (vt) implants. If core logic transistors (not shown) are also formed, the partially processed integrated circuit may also be processed through pwell and nwell implantation and anneal. A gate dielectric, 9006 is then grown or deposited followed by deposition of gate material, 9008. A gate pattern, 9005, is formed on the gate material. In an example embodiment, the p-type substrate is doped with boron with a dopant concentration greater than $1E19/cm^3$. The p-epi layer 9004 is grown to a thickness of 2 to 5 mm with a boron concentration of $1E14$ to $5E16/cm^3$. The gate dielectric is a thermally grown silicon dioxide between 10 to 50 nm depending upon voltage requirements. The gate material is polysilicon or a polysilicon, tungsten silicide stack.

Figure 9B:
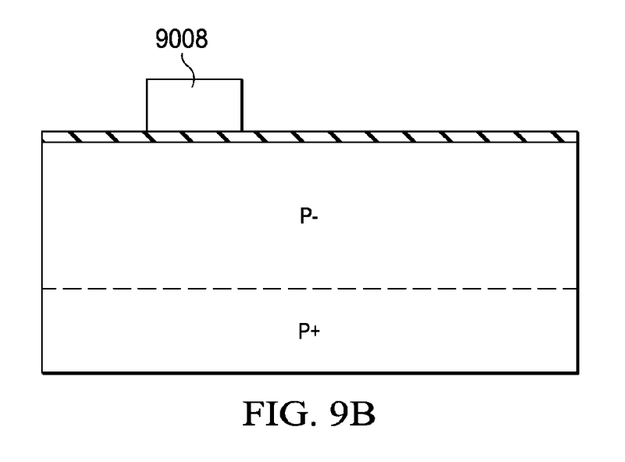

The gate stack is etched to form transistor gate, 9008 in FIG. 9B.

Figure 9C:
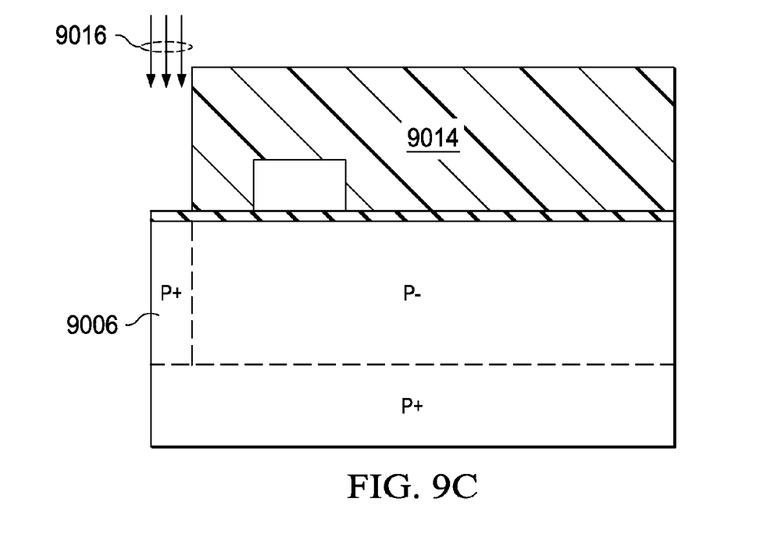

In FIG. 9C, the p-sinker photoresist pattern, 9014, is formed and the sinker diffusion, 9006 is implanted, 9016, and annealed. The sinker may be formed by a series of boron implants at several energies. A low energy implant may be used to dope the sinker near the surface, a medium energy implant to dope the sinker below the surface, and a higher energy implant near the p-substrate, 9000, forming a low resistance connection between the surface of the integrated circuit and the p-substrate, 9000. In an example embodiment, boron is implanted with doses in the range of $5E13$ to $1E15/cm^2$ and energies in the range of 15 to 150 key. The integrated circuit is then annealed between 750 C and 900 C for 20 to 90 minutes to diffuse and activate the sinker dopant.

Although the p-sinker is shown to be formed using implants in this example embodiment, other means of forming the sinker may also be used. For example, a trench may first be etched down to the p-substrate, 9000, and then filled with a conductive material such as doped polysilicon or a deep contact down to the p-substrate may be formed and filled with CVD-W.

Figure 9D:
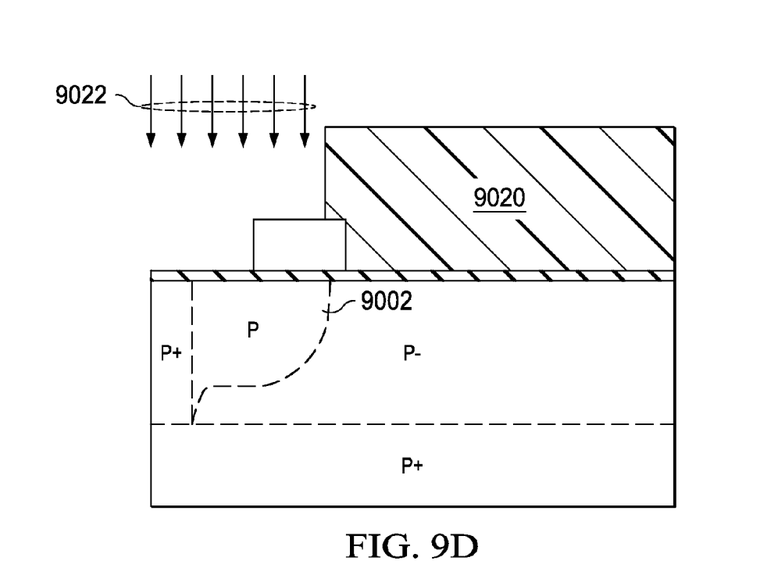

As shown in FIG. 9D, a p-body photoresist pattern 9020 is formed and boron 9022 is implanted to form p-body, 9002. In an example embodiment two implants are used to achieve a uniform p-body doping. In an example embodiment a first implant with a boron dose in the range of $1E13$ to $8E13/cm^2$ is implanted at 40 key and a second implant with a boron 11 dose in the range of $1E13$ to $9E13/cm^2$ is implanted with an energy of 100 key.

Figure 9E:
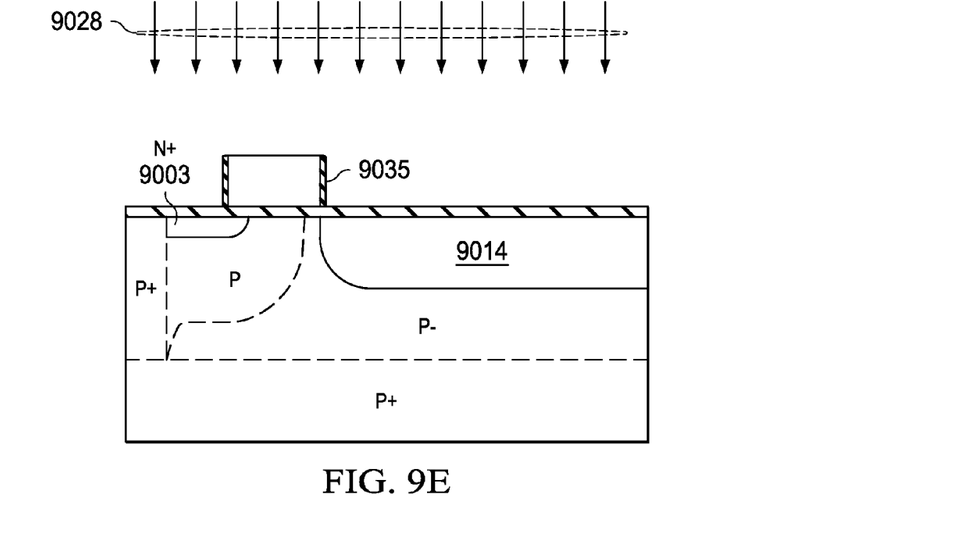

In FIG. 9E, offset sidewalls, 9035, may be formed by conformally depositing a dielectric such as silicon dioxide or silicon nitride and performing an anisotropic etch. A blanket n-extension implant 9028 may be used to form the source extension, 9003 and the drift region 9014 self aligned to the gate 9008. The n-extension implant 9028 may be a patterned implant in core CMOS logic areas to block the n-extension implant 9028 from pmos transistor areas. In an example embodiment, 8 nm to 15 nm SiO2 is deposited and anisotropically etched to form offset sidewall spacers, 9035. The n-extension implant 9028 is a phosphorus implant with a dose in the range of $1E12$ to $1E13/cm^2$ and an energy in the range between 60 and 160 key.

Figure 9F:
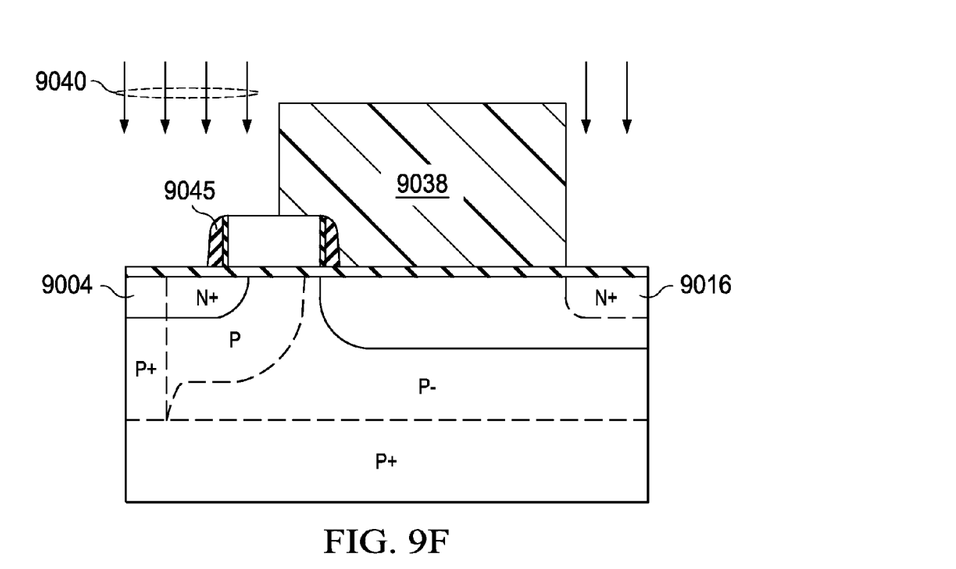

Sidewalls 9045, may be formed by conformally depositing a dielectric such as silicon dioxide or silicon nitride and performing an anisotropic etch as shown in FIG. 9F. An NSD photoresist pattern, 9038, is then formed and n-type dopants are implanted, 9040, to form the source diffusion, 9004 and the drain diffusion 9016. In an example embodiment, SiO2 with a thickness of 40 to 150 nm is deposited and anisotropically etched to form sidewalls 9045. NSD implant 9040 is an arsenic implant with a dose in the range of 3E14 to 1E16/cm$^2$ and an energy in the range of 20 to 100 key.

Figure 9G:
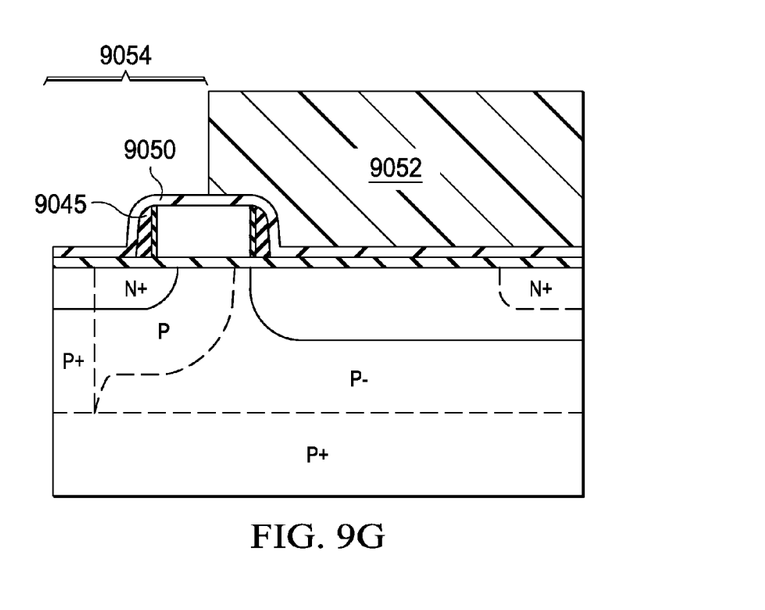

In FIG. 9G a dielectric layer 9050 is deposited over the integrated circuit. A electrode shield contact photoresist pattern, 9052 is formed with openings over the electrode shield contact region, 9054. In an example embodiment SiO2 with a thickness in the range of 100 nm to 300 nm is deposited.

Figure 9H:
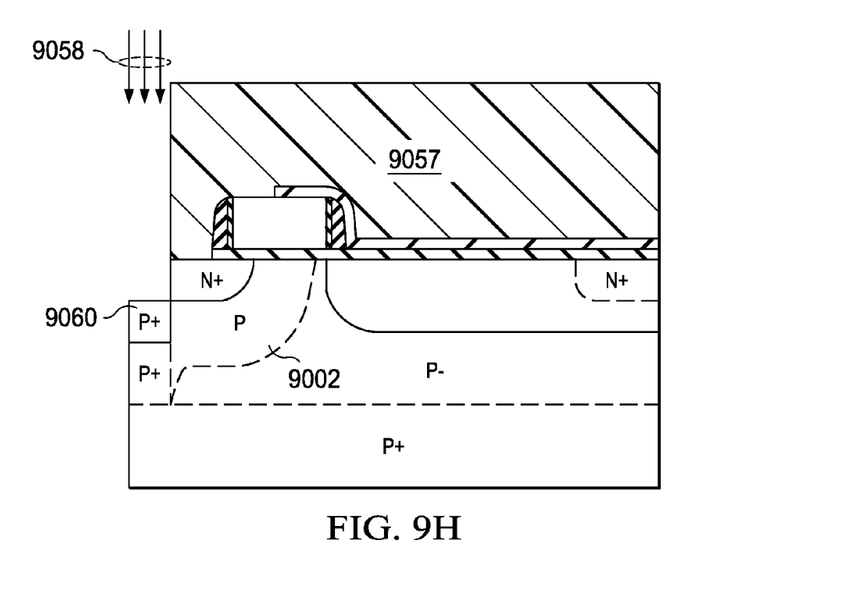

After dielectric layer 9050 is etched a substrate contact photoresist pattern 9057 is formed. The silicon is etched through the N+ source, 9004 to lower the resistance of the substrate contact, 9060. A p-type dopant, such as boron is implanted, 9058 to form substrate contact, 9060 to p-body region, 9002. An anneal is then performed to activate the dopant. In an example embodiment, the silicon is etched to a depth of approximately 250 nm and boron with a dose in the range of 2E15 and 5E15/cm$^2$ and energy in the range of 20 to 50 key is implanted to form substrate contact diffusion, 9060. The anneal may be a rapid thermal anneal with a temperature in the range of 950 to 1050 C.

Figure 9I:
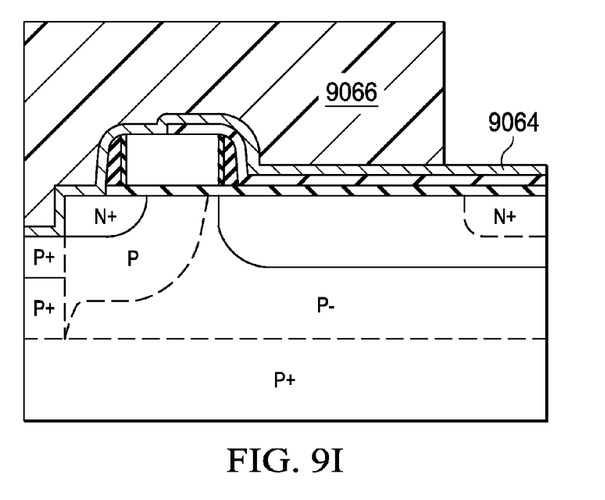

The electrode shield material 9064 is deposited and patterned with electrode shield photoresist pattern, 9066, as shown in FIG. 9I. In an example embodiment the electrode shield is formed by depositing approximately 50 nm titanium plus approximately 60 nm titanium nitride and annealing using RTA at approximately 650 C. The titanium reacts with exposed silicon in the substrate 9060 and on the gate 9008 in the electrode shield contact region, 9054 to form titanium silicide which significantly lowers contact resistance.

Figure 9J:
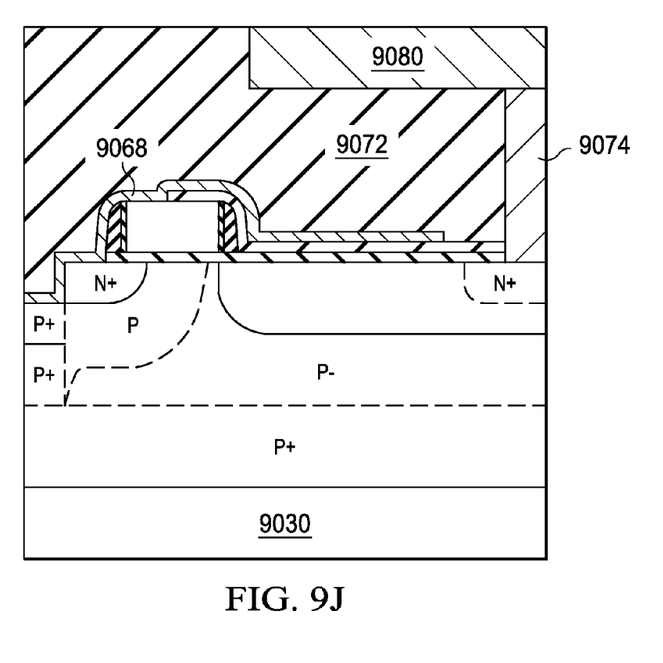

In FIG. 9J the electrode shield material 9064 is etched to form electrode shield 9068. The electrode shield partially overlies drift region, 9014, providing a charge balanced condition in the drift region 9014 which enables the extension to support a higher voltage over a shorter length drift region. This saves cost by reducing area and also improves performance by reducing series resistance.

Premetal dielectric 9072; contact, 9074, and first layer of interconnect, 9080 are formed using well known techniques. In an example embodiment, PMD is a multilayer dielectric deposition composed of a silicon nitride etch stop layer approximately 300 nm to 500 nm thick plus a phosphorus silicate glass layer (or boron-phosphorus silicate glass) with a thickness of between 1000 and 2500 nm. The surface is planarized using CMP. In the example embodiment contact, 9074, is lined with about 60 nm titanium plus 40 nm TiN and filled with a CVD-W plug. The interconnect layer in an example embodiment is a stack composed of approximately 60 nm Ti, 40 nm TiN, 3000 nm Al (0.5% Cu), and 35 nm TiN.

The embodiment CBCD shown in FIG. 9J has a topside cathode, 9080 and a backside anode, 9030. This configuration offers higher performance and lower power operation especially at high frequencies.

As mentioned before various channel diode and charge balanced channel diode designs are possible. In addition, channel diode and charge balanced channel diode designs with a p+ source and lightly doped p-type drift regions are also possible.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising: a channel diode having a drift region with a source, a gate, and a body of said channel diode shorted together using a shorting strap wherein the shorting strap includes an extension that forms an electrode shield over a portion of the drift region.

2. The integrated circuit of claim 1 where said channel diode is an n-channel diode.

3. The integrated circuit of claim 1 where said channel diode is a p-channel diode.

4. The integrated circuit of claim 1 where a cathode terminal is coupled to said drift region and a topside anode is coupled to said source region.

5. An integrated circuit, comprising:
a channel diode having a drift region with a source, a gate, and a body of said channel diode shorted together and further comprising a p-sinker where a cathode terminal is coupled to said drift region and a backside anode is coupled to said source region through said p-sinker.

6. A method of forming an integrated circuit, comprising:
forming a gate over a semiconductor body;
forming a drift region in said semiconductor body on a first side of said gate;
forming a drain region coupled to said drift region;
forming a body region in said semiconductor body under said gate;
forming a source region on a second side of said gate opposite said first side; and
connecting said body region, said source region and said gate to each other by forming a shorting strap, wherein said shorting strap extends over a portion of the drift region to form an electrode shield.

7. The method of claim 6, wherein the step of forming the shorting strap comprises:
depositing a layer of titanium over the gate, body region, and source region;
depositing a layer of titanium nitride over the layer of titanium;
annealing the layers of titanium and titanium nitride to form an electrode shield material connecting the gate, the body region, and the source region; and
patterning and etching the electrode shield material to form the shorting strap.

8. The method of claim 6, wherein said step of connecting comprises forming a contact coupled to said body region, said source region, and said gate.

9. The method of claim 8 wherein said contact is an anode contact and further comprising the step of forming a cathode contact to said drain region.

10. A method of forming an integrated circuit, comprising:
forming a gate over a semiconductor body;
forming a drift region in said semiconductor body on a first side of said gate;
forming a drain region coupled to said drift region;
forming a body region in said semiconductor body under said gate;
forming a source region on a second side of said gate opposite said first side; and
connecting said body region, said source region and said gate to each other,
forming a backside anode contact on a backside of said semiconductor body; and
forming a p-sinker to electrically couple said gate and said source region to said backside anode contact.

* * * * *